United States Patent
Pinder et al.

[11] Patent Number: 5,373,201
[45] Date of Patent: Dec. 13, 1994

[54] POWER TRANSISTOR

[75] Inventors: Brent W. Pinder, Tempe; Kenneth A. Berringer, Scottsdale, both of Ariz.

[73] Assignee: Motorola, Inc., Schaumburg, Ill.

[21] Appl. No.: 12,195

[22] Filed: Feb. 2, 1993

[51] Int. Cl.$^5$ .............................. H03K 17/16
[52] U.S. Cl. .................... 307/113; 327/405; 327/574
[58] Field of Search ............ 307/112, 113, 242, 296.8, 307/299.1, 572, 575, 577, 640, 642; 323/269, 272

[56] References Cited

U.S. PATENT DOCUMENTS

| | | | |
|---|---|---|---|
| 2,980,845 | 4/1961 | Thompson et al. | 323/269 |
| 3,694,669 | 9/1972 | Witt et al. | 307/640 |
| 3,801,894 | 4/1974 | Spiegel | 323/269 |
| 4,290,007 | 9/1981 | Fisher et al. | 323/269 |
| 4,616,142 | 10/1986 | Upadhyay et al. | 323/272 |
| 4,672,235 | 6/1987 | Villa et al. | 307/299 J |
| 4,695,935 | 9/1987 | Oen et al. | 323/272 |
| 4,777,579 | 10/1988 | Jahns et al. | 363/98 |
| 4,896,245 | 1/1990 | Qualich | 61/103 |
| 4,965,710 | 10/1990 | Pelly et al. | 363/56 |

Primary Examiner—Steven L. Stephan
Assistant Examiner—Shawn Riley
Attorney, Agent, or Firm—Gary W. Hoshizaki

[57] ABSTRACT

A power transistor (11) having a control electrode (16), a first electrode (17), a second electrode (181), and a kelvin electrode (19) is provided. The power transistor (11) comprises a plurality of transistors (12–15) coupled in parallel. Each transistor having a control electrode, a first electrode, and a second electrode coupled respectively to the control electrode (16), first electrode (17), and second electrode (18) of the power transistor (11). A plurality of first resistors (26–29) reduce oscillation and ringing, each first resistor is coupled between the kelvin electrode (19) and a second electrode of a transistor of the plurality of transistors (12–15). A plurality of second resistors (21–24) also reduces oscillation and ringing, each second resistor is coupled between the control electrode (16) and a control electrode of a transistor of the plurality of transistors (12–15).

12 Claims, 1 Drawing Sheet

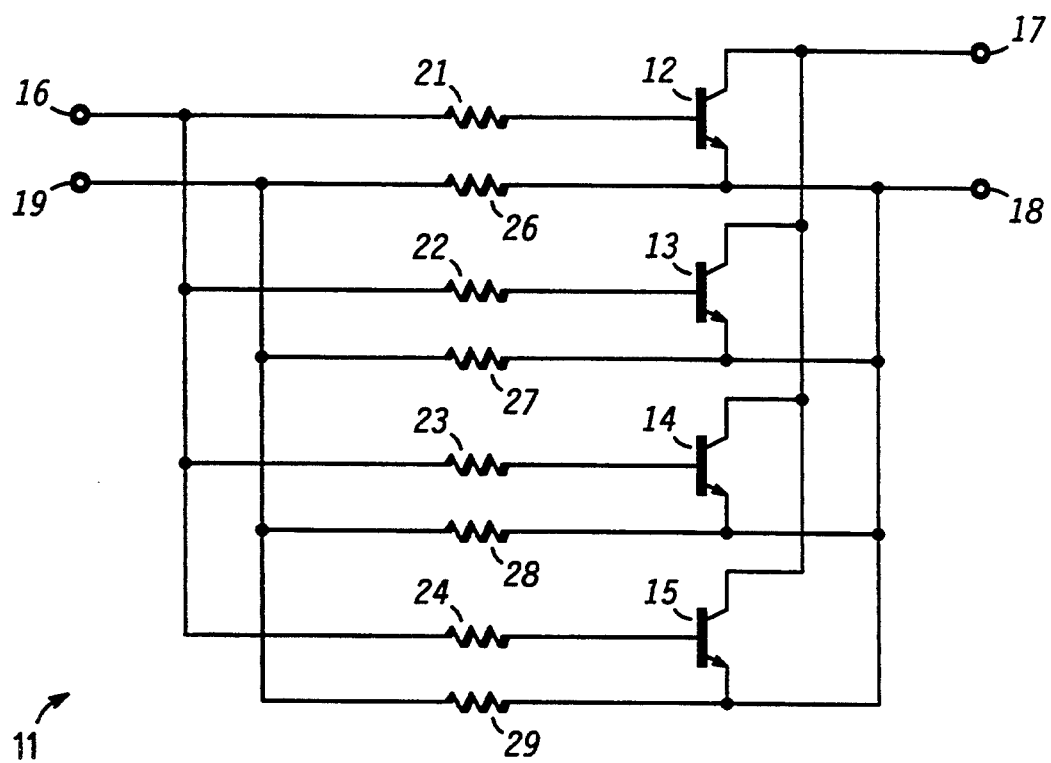
FIG. 1
FIG. 2
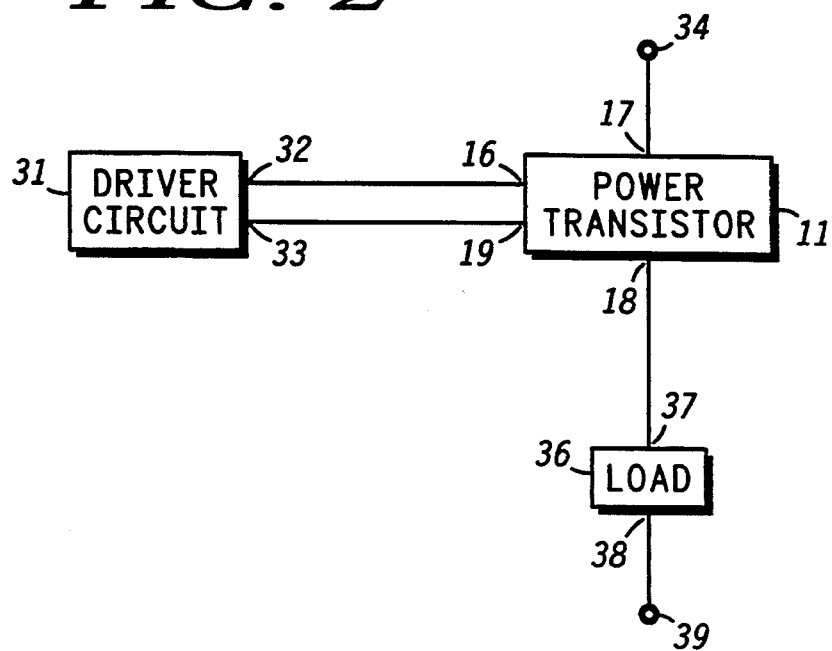

POWER TRANSISTOR

BACKGROUND OF THE INVENTION

This invention relates, in general, to power transistors, and more particularly to power transistors formed from a plurality of transistors coupled in parallel.

It is well known by those skilled in the art that many packaged high power transistors currently on the market comprise multiple power transistor die connected in parallel. The power transistor die connected in parallel may be unstable and oscillate when the packaged power transistor is used in a circuit application. This instability is due to variations in parasitic capacitance and inductance in the individual power transistor die and mutual coupling.

For example, packaged transistors such as a power MOSFET (metallic oxide semiconductor field effect transistor) or an IGBT (insulated gate bipolar transistor) are capable of withstanding over a thousand volts and conducting hundreds of amperes. A technique commonly employed to damp oscillations for these types of power transistors is to place a resistor between the gate of the power transistor and the gate of each individual transistor die which forms the power transistor. The resistor reduces the tendency for the power transistor to oscillate although ringing at the gate is common. An oscillating power device or severe ringing may be of dire consequence to many circuit designs.

It would be of great benefit if a technique could be developed which further decreased the tendency for paralleled power transistors to oscillate and dampens ringing.

SUMMARY OF THE INVENTION

Briefly stated, this invention comprises a power transistor having a control electrode, a first electroder a second electrode, and a kelvin electrode. The power transistor comprises a plurality of transistors coupled in parallel. Each transistor having a control electrode, a first electrode, and a second electrode coupled respectively to the control electrode, the first electrode, and the second electrode of the power transistor. A plurality of resistors are added to prevent oscillations and dampen ringing when the power transistor is activated. Each resistor couples between the kelvin electrode of the power transistor and a second. electrode of a transistor of the plurality of transistors.

BRIEF DESCRIPTION OF THE DRAWINGS

FIG. 1 is an illustration of a power transistor in accordance with the present invention; and FIG. 2 is a schematic of a driver circuit and the power transistor of FIG.1.

DETAILED DESCRIPTION OF THE DRAWINGS

FIG. 1 is an illustration of a plurality of transistors in parallel in accordance with the present invention.

It is well known by those skilled in the art that a power transistor module may comprise more than a single power transistor die. For example, a 600 volt, 400 ampere, power transistor module is formed from four 600 volt, 100 ampere, power transistor die coupled in parallel. High voltage/high current power transistors like the example described above are commonly used for switching applications. Large voltage and current transients are produced in these switching applications. A power transistor formed from multiple parallel transistor die may be prone to oscillation or ringing. The problem occurs due to parasitic capacitance and inductance as well as mutual coupling between semiconductor die. Preventing power transistor oscillation or minimizing ringing is of extreme importance to insure transistor reliability and a stable device for different circuit applications.

A power transistor 11 comprises a transistor 12, 13, 14, and 15 coupled in parallel. In the preferred embodiment, each transistor 12-15 is formed on an individual semiconductor die. The four transistors 12-15 shown in FIG. 1 are for illustration purposes only, the circuit configuration will work for any number of transistors coupled in parallel. Power transistor 11 has a control electrode 16, a first electrode 17, a second electrode 18, and a kelvin electrode 19. Transistors 12-15 are shown as insulated gate bipolar transistors (IGBTs), other types of power transistors such as metallic oxide semiconductor field effect transistors (MOSFETs) or bipolar transistors would also benefit from the configuration. Each transistor 12-15 is of the same conductivity type and are substantially equal in size. Transistors 12-15 have a gate corresponding to a electrode, a collector corresponding to a first electrode, and an emitter corresponding to a second electrode. Each gate, collector, and emitter of transistors 12-15 respectively couples to control electrode 16, first electrode 17, and second electrode of power transistor 11.

In general, the semiconductor die corresponding to each transistor 12-15 is mounted in a package to protect the semiconductor die and other elements which comprise power transistor 11 from an external environment and to dissipate heat away from transistors 12-15. Electrical coupling is typically achieved through patterned metal or a substrate, wire bonding, or other interconnect means.

In the preferred embodiment, a plurality of resistors 21, 22, 23, and 24, which are coupled between the respective gates of transistors 12, 13, 14, and 15 and control electrode 16 reduce oscillation and ringing. In the preferred embodiment, resistors 21-24 are discrete resistors. If additional transistors were coupled in parallel each would have a resistor coupled between control electrode 16 and the gate of the additional transistor. Generally, resistors 21-24 prevent oscillation but ringing is present at control electrode 16 of power transistor 11.

Kelvin electrode 19 is a low current coupling to the emitter of each transistor 12-15. Kelvin electrode 19 is typically used for sensing and enabling purposes. In this example, it will also significantly dampen ringing at control electrode 16 of power transistor 11. A plurality of resistors 26, 27, 28, and 29 are the key to prevent ringing. Resistor 26 is coupled between the emitter of transistor 12 and kelvin electrode 19. Resistor 27 is coupled between the emitter of transistor 13 and kelvin electrode 19. Resistor 28 is coupled between the emitter of transistor 14 and kelvin electrode 19. Resistor 29 is coupled between the emitter of transistor 15 and kelvin electrode 19. In the preferred embodiment, resistors 26-29 are discrete resistors. If additional transistors were coupled in parallel each would have a resistor coupled between kelvin electrode 19 and the emitter of the additional transistor. Kelvin electrode 19 is typically coupled to a terminal of a driver circuit (not shown) for enabling and disabling power transistor 11.

An example of a power transistor and the relative resistor values needed for compensation is listed below. The power transistor comprises four transistors coupled in parallel, each transistor is an individual semiconductor die and capable of withstanding 600 volts and conducting 100 amperes. The power transistor withstands 600 volts and conducts up to 400 amperect. Each resistor coupled between a control electrode of a transistor and a control electrode of the power transistor has a resistive value of approximately 3 ohms. From experimental data the 3 ohm resistor value prevents oscillation when the power transistor is enabled by a typical driver circuit but is susceptible to severe control electrode ringing. Each resistor coupled between a second electrode of a transistor and a kelvin electrode of the power transistor has a resistive value of approximately 1 ohm. The kelvin electrode couples to a terminal of the driver circuit. The 1 ohm resistors appreciably dampen the control electrode ringing. Actual resistor values chosen for a specific power transistor application are a function of the characteristics (voltage/current ratings, transistor type, etc.) of the transistors used to form the power transistor, the package and parasitics (inductance/capacitance) associated with package, interconnect (wire bonds, wiring, printed circuit board, etc.), and the circuit application for the power transistor. Modeling and simulation of the power transistor may aid in determining the exact values needed for the application.

FIG. 2 is a schematic of a driver circuit 31 and power transistor 11 of FIG. 1. FIG. 2 is an example of a typical application for power transistor 11. Driver circuit 31 enables power transistor 11 which drives a load 36. Driver circuit 31 has a terminal 32 coupled to control electrode 16 of power transistor 11 and a terminal 33 coupled to kelvin electrode 19 of power transistor 11. First electrode 17 is coupled to a terminal 34 of a first power supply. Second electrode is coupled to a terminal 37 of load 36. A terminal 38 of load 36 is coupled to a terminal 39 of a second power supply.

Driver circuit 11 produces a positive voltage across terminals 32 and 33 to enable power transistor 11. Enabled power transistor 11 couples the first powder supply to load 36. In general, driver circuit 11 outputs a voltage of less than 20 volts to enable power transistor 11 whereas hundreds of volts is couplet across load 36. Gate ringing is substantially reduced in this configuration. Other configurations to enable power transistor 11 will generate similar results.

By now it should be appreciated that a power transistor has been shown which eliminates oscillation and dampens ringing when parallel coupled transistors are used to form the power transistor.

We claim:

1. A power transistor having a control electrode, a first electrode, a second electrode, and a kelvin electrode, the kelvin electrode for sensing or enabling the power transistor, the power transistor comprising:

a plurality of transistors, each transistor of said plurality of transistors having a control electrode coupled to the control electrode of the power transistor, a first electrode coupled to the first electrode of the power transistor, and a second electrode coupled to the second electrode of the power transistor; and a plurality of first resistors for reducing ringing at the control electrode of the power transistor, each one of said plurality of first resistors being coupled between the kelvin electrode of the power transistor and a second electrode of a respective transistor of said plurality of transistors wherein a voltage applied across said control and kelvin electrodes of the power transistor enables the power transistor for driving a load at said first or second electrodes of the power transistor and wherein said kelvin electrode is a low current path.

2. The power transistor of claim 1 further including a plurality of second resistors, each one of said plurality of second resistors being coupled between the control electrode of the power transistor and a control electrode of a respective transistor of said plurality of transistors.

3. The power transistor of claim 2 wherein said plurality of second resistors are discrete resistors.

4. The power transistor of claim 1 wherein said plurality of transistors are of a same conductivity type.

5. The power transistor of claim 1 wherein said plurality of transistors are substantially equal in size.

6. The power transistor of claim 1 wherein said plurality of transistors are formed on individual semiconductor die.

7. The power transistor of claim 1 wherein said plurality of first resistors are discrete resistors.

8. A power transistor having a control electrode, a first electrode, a second electrode, and a kelvin electrode, the kelvin electrode for sensing or enabling the power transistor, the power transistor comprising:

a plurality of transistors, each transistor of said plurality of transistors having a control electrode coupled to the control electrode of the power transistor, a first electrode coupled to the first electrode of the power transistor, and a second electrode coupled to the second electrode of the power transistor;

a plurality of first resistors for reducing ringing at the control electrode of the power transistor, each one of said plurality of first resistors being coupled between the kelvin electrode of the power transistor and said second electrode of a respective transistor of said plurality of transistors; and a plurality of second resistors, each one of said plurality of second resistors being coupled between the control electrode of the power transistor and said control electrode of a respective transistor of said plurality of transistors.

9. The power transistor of claim 8 wherein each transistor of said plurality of transistor is an individual semiconductor die.

10. The power transistor of claim 8 wherein said plurality of transistors are substantially equal in size.

11. The power transistor of claim 8 wherein said plurality of transistors are of a same conductivity type.

12. The power transistor of claim 8 wherein said first resistors (26–29) and said second resistors (21–24) are discrete resistors.

* * * * *